United States Patent
Liu et al.

(10) Patent No.: US 9,086,881 B2
(45) Date of Patent: Jul. 21, 2015

(54) MECHANISM FOR FACILITATING WRITE TRACKING FOR FOLLOWING DATA EYE MOVEMENTS ACROSS CHANGING THERMAL CONDITIONS IN MEMORY SYSTEMS

(75) Inventors: Tsun Ho Liu, Fremont, CA (US); Andre Schaefer, Braunschweig (DE); Hoi M. Ng, San Ramon, CA (US); Guy R. Murray, Folsom, CA (US); Oleg Mikulchenko, Folsom, CA (US); Xiaofang Gao, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 13/538,881

(22) Filed: Jun. 29, 2012

(65) Prior Publication Data

US 2014/0006702 A1    Jan. 2, 2014

(51) Int. Cl.
*G11C 11/406* (2006.01)
*G06F 1/32* (2006.01)

(52) U.S. Cl.
CPC ........ *G06F 1/3275* (2013.01); *G11C 11/40611* (2013.01); *Y02B 60/1225* (2013.01); *Y02B 60/1228* (2013.01)

(58) Field of Classification Search
CPC .............. G06F 13/1636; G11C 11/406; G11C 2211/4061; H04L 7/0025
USPC .................................................. 711/170, 106
See application file for complete search history.

(56) References Cited

U.S. PATENT DOCUMENTS

2009/0252265 A1 * 10/2009 Xia et al. ........................ 375/355
2013/0055039 A1 *  2/2013 Dearth .......................... 714/720

FOREIGN PATENT DOCUMENTS

WO    WO 2010085405 A1 *  7/2010

OTHER PUBLICATIONS

Sang-Hyun Lee; Moon-Sang Hwang ; Youngdon Choi ; Sungjoon Kim ; Yongsam Moon ; Bong-Joon Lee ; Deog-Kyoon Jeong ; Kim, Wonchan ; Chan Hyeong Park ; Ahn, Gijung. "A 5-Gb/s 0.25-µm CMOS jitter-tolerant variable-interval oversampling clock/data recovery circuit." Dec. 2002. IEEE Journal of Solid-State Circuits: vol. 37, Issue: 12. pp. 1822-1830.*

* cited by examiner

*Primary Examiner* — Mohammad Islam
*Assistant Examiner* — Mikka Liu
(74) *Attorney, Agent, or Firm* — Blakely, Sokoloff, Taylor & Zafman LLP

(57) ABSTRACT

A mechanism is described for facilitating write tracking for following data eye movements across changing thermal conditions in memory systems according to one embodiment of the invention. A method of embodiments of the invention includes monitoring movements of a valid data eye associated with a memory device of a plurality of memory devices of a memory system at a computing system. The monitoring may include initiating write commands during one or more refresh periods associated with the valid data eye. The method may include determining drifting in the movement of the data eye, and correcting the drifting based on adjusting one or more existing phase interpolator values associated with the movements of the data eye.

24 Claims, 5 Drawing Sheets

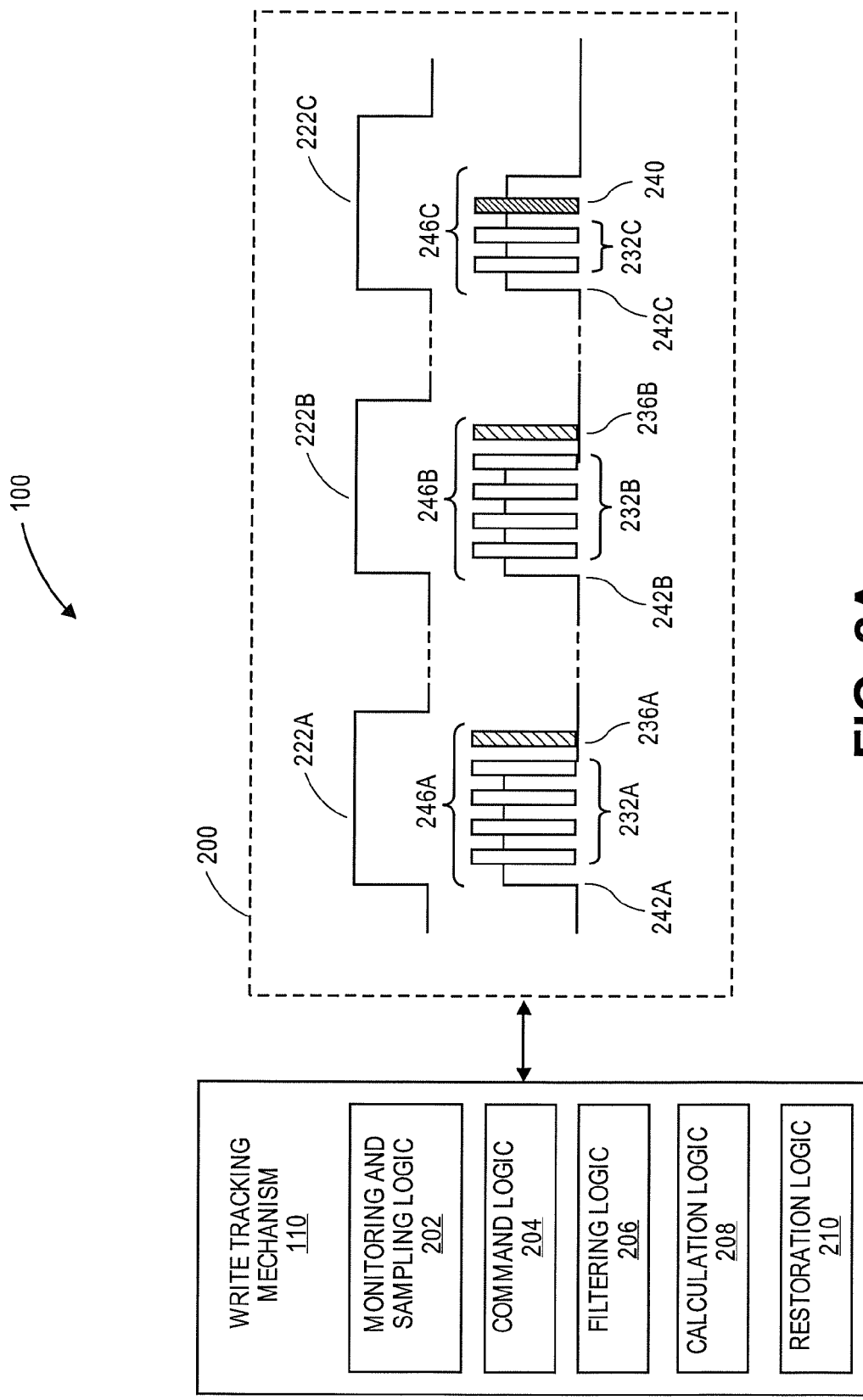

MECHANISM FOR FACILITATING WRITE TRACKING FOR FOLLOWING DATA EYE MOVEMENTS ACROSS CHANGING THERMAL CONDITIONS IN MEMORY SYSTEMS

FIELD

Embodiments of the invention relate to memory systems. More particularly, embodiments of the invention relate to a mechanism for facilitating write tracking for following data eye movements across changing thermal conditions in memory systems.

BACKGROUND

With increasing memory speeds, memory systems are required to have precise timing. However, along with increasing speeds, other factors can convolute the timing process. For example, increasing speeds can narrow the eye, while changing thermal conditions can cause the eye to drift. The eye is defined as having two edges and data between the two edges can be latched and is considered valid, while any data outside the two edges is regarded as invalid. A range timing from the beginning to the end of valid data is referred to as the valid data eye.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in details in order not to obscure the understanding of this description.

In one embodiment, a mechanism is provided for facilitating write tracking for following eye movements across changing thermal conditions in memory systems. Managing precise timing can particularly difficult and complex for some of the latest memory systems, such as new versions of double data rate (DDR) synchronous dynamic random access memory (SDRAM) (e.g., DDR, DDR2, DDR3, DDR4, DDR5, etc.) and its latest graphics version (e.g., graphic DDR5 (GDDR5)). For example, unlike other DRAM products, GDDR5 DRAM does not provide any strobe signals and thus communication between a DRAM controller and memory systems need to be trained. Due to GDDR5 DRAM's the high speed data rate (e.g., 5.5 Gb/s), its data eye width may be relatively small or narrow and have virtually no tolerance to thermal/temperature changes and variation on transmit data lines, which can cause severe reliability and performance issues.

For brevity, clarity and ease of understanding, this document focuses on GDDR5 DRAM as an example, but it is contemplated that embodiments of the present invention are not limited to GDDR5 DRAM and that they are applicable to and workable with any number and type of existing and future memory systems or subsystems, computing systems, or the like. Regarding thermal (temperature) changes, any number and type of conditions can cause such changes, such as workload sizes that can result in varying power consumptions. For example, a large workload can require a greater power consumption that can result in a higher thermal load.

Figure 1:
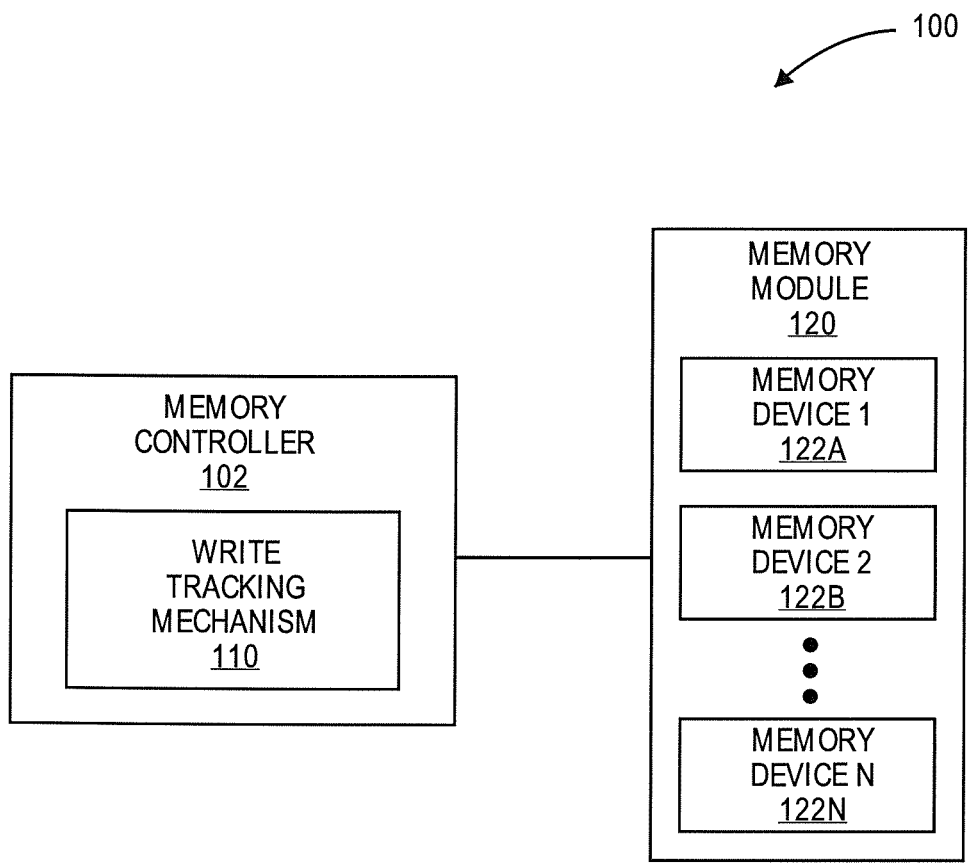
FIG. 1 illustrates a memory controller employing a write tracking mechanism according to one embodiment of the invention.

FIG. 1 illustrates a memory controller 102 employing write tracking mechanism 110 according to one embodiment of the invention. In the illustrated embodiment, memory controller 102 of a memory system 100 at a computing system (such as computing system 400 of FIG. 4). Memory controller 102 may be an integrated circuit or part of a processor and/or a memory, such as processor 410 and/or memory 420, respectively, of computer system 400 of FIG. 4. In one embodiment, memory controller 102 employs write tracking mechanism ("tracking mechanism") 110 to perform various operations of write tracking of data eye movements in data or byte lanes (e.g., DQ0, DQ1, DQ2, DQ7, etc.) relating to memory devices 122A-122N (e.g., GDDR5 DRAM, etc.) of memory subsystem or module 120 over changing temperatures. Temperature changes in data devices 122A-122N may be monitored using, for example, a temperature/thermal sensor at each data device 122A-122N. For example, as aforementioned, thermal or temperature variations may occur due to several factors, such as changing memory throughput or performance, and the amount or level of temperature changes (e.g., for high to low and vice versa) may be directly or inversely proportional to such factors. Such temperature variations can lead to thermal drifting of data eyes within the data lanes associated with memory devices.

FIG. 2A illustrates an embodiment of write tracking mechanism 110. In one embodiment, write tracking mechanism 110 is employed at a memory controller (such as memory controller 102 of FIG. 1) of memory system 100 of a computing system (such as computing system 400 of FIG. 4). In one embodiment, tracking mechanism 110 includes monitoring and sampling logic 202, command logic 204, filtering logic 206, calculation logic 208, and restoration logic 210 to perform various operations of write tracking of eye movements relating to a data lane associated with a memory device (e.g., GDDR5 DRAM, etc.), such as memory devices 122A-122N of FIG. 1, over changing temperatures. As discussed with reference to FIG. 1, memory devices may be part of memory modules or subsystems that are in communication with a memory controller. It is contemplated that memory devices 122 are in no way limited to GDDR5 DRAM (discussed here), DDRx, or the like and that they may include any number and type of memory devices that are in existence or will be in the future. Moreover, additional memory modules or subsystems may be employed as necessitated or desired and that embodiments are not limited to simply single data lane, illustrated here, or a single memory module 120 illustrated in FIG. 1.

Due to temperature variations, a trained transmit data eye of a data/byte lane (e.g., DQ0) may start drifting, such as moving away from its original trained location, causing instability that can be problematic and difficult to overcome. In one embodiment, data lane is monitored by monitoring and sampling logic 202 of tracking mechanism 110 to determine and follow any eye movements within it across changing temperatures so the extent of the eye movements can be calculated and corrected to avoid any potential memory problems. It is contemplated that tracking mechanism 110 may monitor and calculate eye drifting associated with each data lane separately or multiple data lanes simultaneously and it is further contemplated that the results may be based on monitoring and examination of each data lane or average of several data lanes or the like.

In one embodiment, the monitoring by monitoring and sampling logic 202 includes detecting refresh periods 222A-222C and sampling each refresh period 222A-222C. For example, during each refresh period 222A-222C, refresh commands 242A-242C are triggered. With the triggering of refresh commands 242A-242C, a number of write training command 246A-246C are issued. In one embodiment, command logic 204 issues write training commands 246A-246c during each refresh period 222A-222C to facilitate tracking of data eyes of the transmit data lane, starting with a left edge of a data eye and going toward a right edge to determine data eye movements due to temperature variance. In one embodiment, of the illustrated write training commands 246A-246C, write training commands 232A-232C are regarded as regular write training commands, while write training commands 236A-236B are regarded as novel restore write commands that are used for restoring the old and known data eye center phase interpolator (PI) value and training the frame. In one embodiment, if the write tracking process 200 remains incomplete and continues, restore write commands 236A-236B restore the old PI and train the frame base on the available data. In such cases, the write tracking process 200 continues and resumes with the next refresh period, such as refresh periods 222B and 222C, until the write tracking process 200 (e.g., PI value search that may then be used for the final PI value calculation) is completed with the novel final write command 240, such as during refresh period 222C where the novel final write command 240 represents and is based on a newly calculated PI value (e.g., new calculated PI value=old/original PI value+/−a programmed PI value). This is further defined below.

In one embodiment, filter logic 206 measures the movement of each data eye during its corresponding refresh period 222A-222C to determine whether any adjustments are to be made to maintain consistency in tracking and consequently, data collection. If no adjustments are to be made, the write tracking process 200 continues with normalcy. If, however, an adjustment is to be made, filter logic 206 communicates that need to calculation logic 208, where calculation logic 208 assigns or adds a programmable offset to each transmit data lane and/or to each date eye based on the corresponding current PI value.

The write tracking process 200 may be performed for a defined period of time depending on a number of factors, such as, but not limited to, memory size, memory and/or computer system resources and/or capacity, amount of data eye drifting, number of adjustments needed or made, and the like. In one embodiment, a user (e.g., system administrator, software developer, etc.) may assign a time period or set a time limit, as necessitated or desired, on how long the write tracking process 200 may be performed. Similarly, a certain amount of write tracking may be performed during each refresh period 222A-222C and continued on to the next one if remained incomplete. For example and in one embodiment, if the write tracking period is not completed during an assigned period of time or during a particular refresh period 222A, 222B, restore logic 210 may restore parameters 236A, 236B relating to the previous trained eye at the end of the current refresh period 222A, 222B in order to avoid sacrificing bandwidth and/or performance. For example, the current PI values may be saved and restored and, according to these restored current PI values, the frames are retrained. The write tracking process 200 may resume with the next refresh period 222C and continue on until the write tracking process 200 (e.g., PI value search) is completed with the final write training command 240, such as during refresh period 222C.

In one embodiment, calculation logic 208 performs multi-frame comparison per each PI value search, where a frame is defined as two unit intervals, while a single set of PI value with a unique frame value may result in finding the possible data eye region. For example and in one embodiment, a determination is made as to whether the determined or searched PI value is more than a predefined threshold. A threshold may be a predefined PI value in light of known or calculated or predicted temperature variations (as determined by, for example, the user or the manufacturer or automatically by the computing system or other sources) to keep the memory system 100 working normally and efficiently by keeping data eyes and their centers from drifting too much in response to thermal changes.

Further, PI values are adjusted with a programmed offset based on the searched (newly determined) PI values and, according to these new PI values and the resulting programmed offset, the frames. For example, if the current PI value is 8 and the newly-determined PI value is 10, the current PI values may be adjusted by a programmed offset of, for example, 1, and, vice versa, detected. For example and in one embodiment, the calculated PI value may not equal to the new searched PI value, but an adjusted PI value using a programmed offset may be applied to achieve the desired result. It is contemplated that these values are merely examples and that any value can be calculated and used for adjustment. This technique of multi-frame comparison, using calculation logic 208, speeds up the write tracking process 200 including the PI value search. Further, this novel technique improves tolerance to temperature changes, while maintain maximum high memory bandwidth for memory system 100.

It is contemplated that any number and type of components may be added to and/or removed from write tracking mechanism 110 to facilitate various embodiments of the invention including adding, removing, and/or enhancing certain features. For brevity, clarity, and ease of understanding of write tracking mechanism 110, many of the standard and/or known components, such as those of a computing device, are not shown or discussed here. It is contemplated that embodiments of the invention are not limited to any particular technology, topology, system, architecture, and/or standard and are dynamic enough to adopt and adapt to any future changes.

Figure 2B:
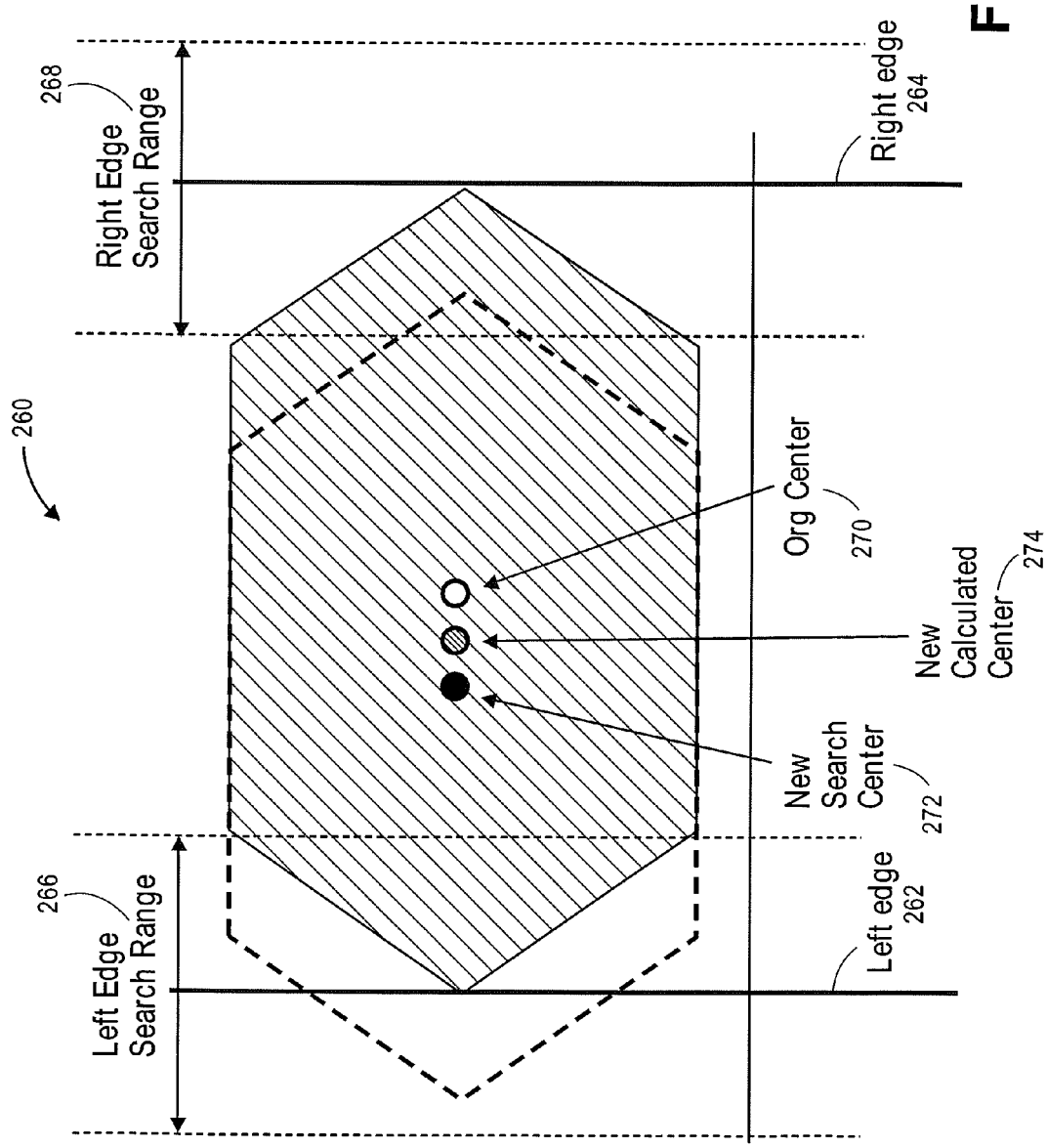
FIG. 2 illustrates an embodiment of a write tracking mechanism.

FIG. 2B illustrates an embodiment of an eye 260 its movements. In one embodiment, as illustrated, the eye 260 has two edges, such as a left edge 262 and a right edge 264. The movement of the two edges 262 and 264 within their corresponding ranges 266 and 268 show the movement of the eye 260. It is further illustrated that with the search ranges 266, 268 is also shown the movement of the center of eye from the original center 270 to the new searched center 272. The placement or the measurements of the known original center 270 and the new searched center 272 are then used to calculate a new calculated center 274. For example, once the PI value of the new searched center 272 is known through the novel write tracking process (such as the write tracking process 200 of FIG. 2A) and the filtering logic 206 returns true after comparing the delta between the original center 270 and the new search centered 272 with the programmed threshold value, the new calculated center 274 can be computed by simply calculating its new PI value by deducting the old PI value associated with the original center 270 from the programmed offset.

Figure 3:
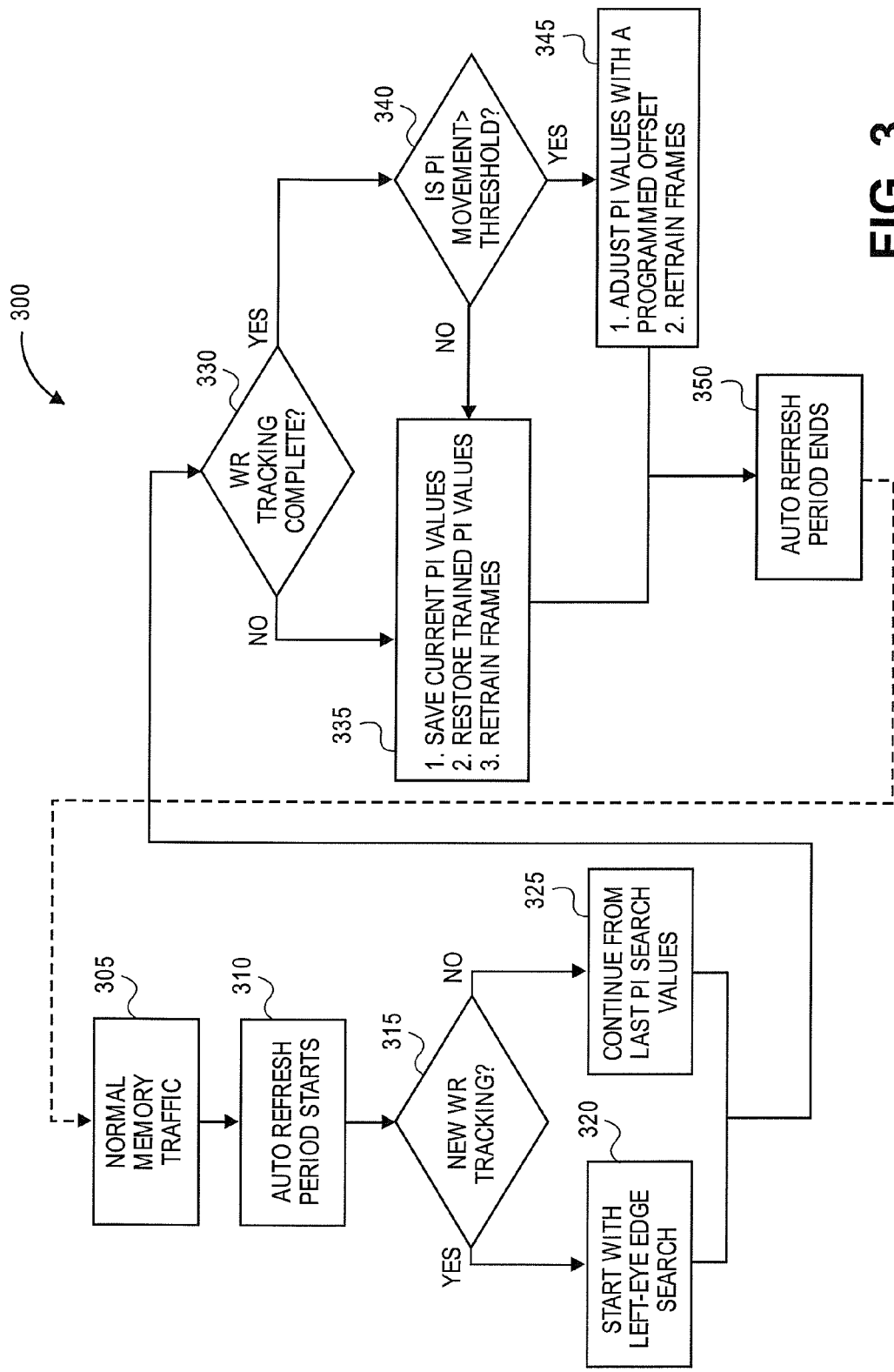
FIG. 3 illustrates a method for performing write tracking process to track data eye movements within a data lane of a memory device according to one embodiment of the invention.

FIG. 3 illustrates a method for performing write tracking process to track data eye movements within a data lane of a memory device according to one embodiment of the invention. Method 300 may be performed by processing logic that may comprise hardware (e.g., circuitry, dedicated logic, programmable logic, etc.), software (such as instructions run on a processing device), or a combination thereof. In one embodiment, method 300 may be performed by the write tacking mechanism 110 of FIG. 1.

Method 300 begins at block 305 with a normal memory traffic at a memory device (e.g., GDDR5 DRAM) of a number of memory devices of a memory system of a computing system. At block 310, an auto refresh period starts in a data lane associated with the memory device. At block 315, a determination is made as to whether a new write tracking process is to begin at the data lane with the currently detected auto refresh period. If yes, at block 320, the write tracking process begins at the left eye edge of the data eye. If not, at block 325, it restores the PI from where it left in the previous write tracking, which was last refresh period, and it continues the write tracking process. In one embodiment, the write tracking process may begin with the command logic of the write tracking mechanism sending write commands during the refresh period.

In one embodiment, at block 330, a determination is made as to whether further write tracking is to be performed. If yes, at block 335, (1) current PI values are saved, (2) trained PI values are restored, and (2) frames are retrained according to the current PI value. Stated differently, and as aforementioned, the write tracking period ends according to a predetermined time period or with the end of the current refresh period, such as by restoring the current parameters relating to the previous trained eye at the end of the refresh period in order to avoid sacrificing bandwidth and/or performance. At block 350, auto refresh period ends and normal memory traffic is restored at block 305.

Referring back to block 330, if the write tracking is completed, the process continues at block 340 where another determination is made as to whether the determined PI is more than a predefined threshold. If not, the process refers to block 335. If yes, (1) the PI values are adjusted with a programmed offset based on the newly-determined or searched PI value and (2) frames are retrained according to the new programmed offset and PI values. At block 350, auto refresh period ends and normal memory traffic is restored at block 305.

Figure 4:
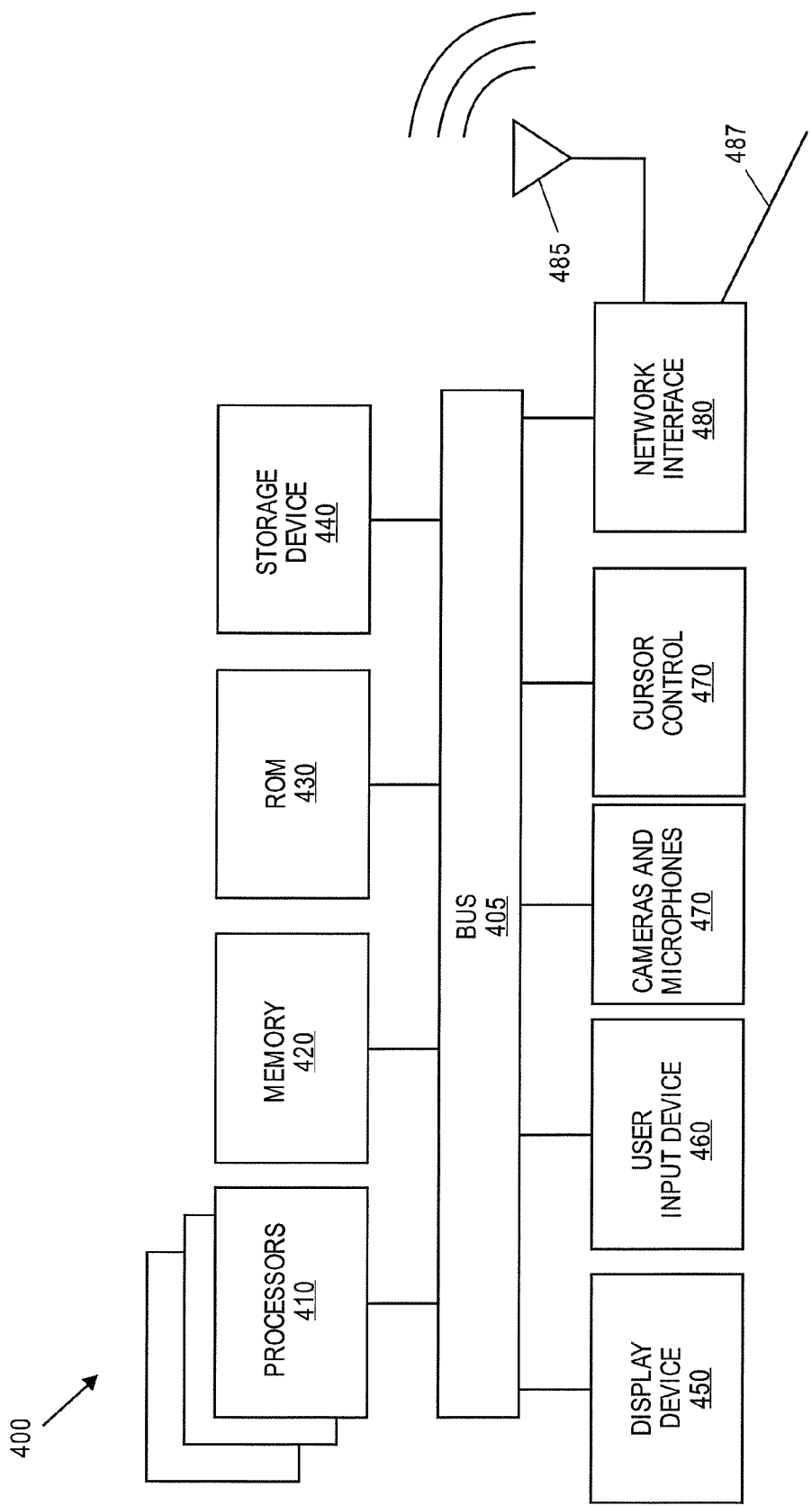
FIG. 4 is block diagram of a computer system suitable for implementing embodiments of the present disclosure according to one embodiment of the invention.

FIG. 4 illustrates an embodiment of a computing system 400. Computing system 400 represents a range of computing and electronic devices (wired or wireless) including, for example, desktop computing systems, laptop computing systems, cellular telephones, personal digital assistants (PDAs) including cellular-enabled PDAs, set top boxes, smartphones, tablets, etc. Alternate computing systems may include more, fewer and/or different components.

Computing system 400 includes bus 405 (or a link, an interconnect, or another type of communication device to communicate information) and processor 410 coupled to bus 405 that may process information. While computing system 400 is illustrated with a single processor, electronic system 400 and may include multiple processors and/or co-processors, such as one or more of central processors, graphics processors, and physics processors, etc. Computing system 400 may further include random access memory (RAM) or other dynamic storage device 420 (referred to as main memory), coupled to bus 405 and may store information and instructions that may be executed by processor 410. Main memory 420 may also be used to store temporary variables or other intermediate information during execution of instructions by processor 410.

Computing system 400 may also include read only memory (ROM) and/or other storage device 430 coupled to bus 405 that may store static information and instructions for processor 410. Date storage device 440 may be coupled to bus 405 to store information and instructions. Date storage device 440, such as magnetic disk or optical disc and corresponding drive may be coupled to computing system 400.

Computing system 400 may also be coupled via bus 405 to display device 450, such as a cathode ray tube (CRT), liquid crystal display (LCD) or Organic Light Emitting Diode (OLED) array, to display information to a user. User input device 460, including alphanumeric and other keys, may be coupled to bus 405 to communicate information and command selections to processor 410. Another type of user input device 460 is cursor control 470, such as a mouse, a trackball, or cursor direction keys to communicate direction information and command selections to processor 410 and to control cursor movement on display 450.

Camera and microphone arrays 490 of computer system 400 may be coupled to bus 405 to observe gestures, record audio and video and to receive and transmit visual and audio commands.

Computing system 400 may further include network interface(s) 480 to provide access to a network, such as a local area network (LAN), wide area network (WAN), metropolitan area network (MAN), personal area network (PAN), an intranet, the Internet, etc. Network interface(s) 480 may include, for example, a wireless network interface having antenna 485, which may represent one or more antenna(e). Network interface(s) 480 may also include, for example, a wired network interface to communicate with remote devices via network cable 487, which may be, for example, an Ethernet cable, a coaxial cable, a fiber optic cable, a serial cable, or a parallel cable.

Network interface(s) 480 may provide access to a LAN, for example, by conforming to IEEE 802.11b and/or IEEE 802.11g standards, and/or the wireless network interface may provide access to a personal area network, for example, by conforming to Bluetooth standards. Other wireless network interfaces and/or protocols, including previous and subsequent versions of the standards, may also be supported.

In addition to, or instead of, communication via the wireless LAN standards, network interface(s) 480 may provide wireless communication using, for example, Time Division, Multiple Access (TDMA) protocols, Global Systems for Mobile Communications (GSM) protocols, Code Division, Multiple Access (CDMA) protocols, and/or any other type of wireless communications protocols.

Network interface(s) 480 may including one or more communication interfaces, such as a modem, a network interface card, or other well-known interface devices, such as those used for coupling to the Ethernet, token ring, or other types of physical wired or wireless attachments for purposes of providing a communication link to support a LAN or a WAN, for example. In this manner, the computer system may also be coupled to a number of peripheral devices, clients, control surfaces, consoles, or servers via a conventional network infrastructure, including an Intranet or the Internet, for example.

It is to be appreciated that a lesser or more equipped system than the example described above may be preferred for certain implementations. Therefore, the configuration of computing system 400 may vary from implementation to implementation depending upon numerous factors, such as price constraints, performance requirements, technological improvements, or other circumstances. Examples of the electronic device or computer system 400 may include without limitation a mobile device, a personal digital assistant, a mobile computing device, a smartphone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combinations thereof.

Embodiments may be implemented as any or a combination of: one or more microchips or integrated circuits interconnected using a parentboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

Embodiments may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection). Accordingly, as used herein, a machine-readable medium may, but is not required to, comprise such a carrier wave.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments. Specifics in the examples may be used anywhere in one or more embodiments. The various features of the different embodiments may be variously combined with some features included and others excluded to suit a variety of different applications. Some embodiments pertain to a method comprising monitoring movements of a valid data eye associated with a memory device of a plurality of memory devices of a memory system at a computing system, wherein monitoring includes initiating write commands during one or more refresh periods associated with the valid data eye; determining drifting in the movement of the data eye; and correcting the drifting based on adjusting one or more existing phase interpolator values associated with the movements of the data eye.

Embodiments include any of the above methods wherein monitoring comprising checking a left edge and a right edge of the valid data eye, where checking begins with the left edge moving onwards the right edge.

Embodiments include any of the above methods wherein determining comprises: searching one or more new PI values; and comparing the one or more new PI values with a threshold value.

Embodiments include any of the above methods wherein adjusting the one or more exiting PI values includes updating the one or more existing PI values to the one or more new PI values, if the one or more new PI values are greater than the threshold value.

Embodiments include any of the above methods further comprising restoring, during a refresh period, current parameters associated with the valid data eye if monitoring is expected to continue beyond the refresh period into a next refresh period.

Embodiments include any of the above methods further comprising initiating additional write commands during the next refresh period to continue monitoring movements of the valid data eye.

Embodiments include any of the above methods wherein drifting in the movement is caused by thermal variations in the memory device.

In another embodiment, a memory controller comprises: a write tracking mechanism having first logic to monitor movements of a valid data eye associated with a memory device of a plurality of memory devices of a memory system at a computing system, wherein monitoring includes initiating write commands during one or more refresh periods associated with the valid data eye; second logic to determine drifting in the movement of the data eye; and third logic to correct the drifting based on adjusting one or more existing phase interpolator values associated with the movements of the data eye.

Embodiments include the memory controller above wherein the first logic is further to check a left edge and a right edge of the valid data eye, where checking begins with the left edge moving onwards the right edge.

Embodiments include the memory controller above wherein the second logic is further to: search one or more new PI values; and compare the one or more new PI values with a threshold value.

Embodiments include the memory controller above wherein adjusting the one or more exiting PI values includes updating the one or more existing PI values to the one or more new PI values, if the one or more new PI values are greater than the threshold value.

Embodiments include the memory controller above wherein the third logic is further to restore, during a refresh period, current parameters associated with the valid data eye if monitoring is expected to continue beyond the refresh period into a next refresh period.

Embodiments include the memory controller above wherein the first logic is further to initiate additional write commands during the next refresh period to continue monitoring movements of the valid data eye.

Embodiments include the memory controller above wherein drifting in the movement is caused by thermal variations in the memory device.

In another embodiment, a system comprises: a plurality of memory devices at a computing system; and a write tracking mechanism to monitor movements of a valid data eye associated with a memory device of the plurality of memory devices, wherein monitoring includes initiating write commands during one or more refresh periods associated with the valid data eye, determine drifting in the movement of the data eye, and correct the drifting based on adjusting one or more existing phase interpolator values associated with the movements of the data eye.

Embodiments include the system above wherein the write tracking mechanism is further to check a left edge and a right edge of the valid data eye, where checking begins with the left edge moving onwards the right edge.

Embodiments include the system above wherein the write tracking mechanism is further to: search one or more new PI values; and compare the one or more new PI values with a threshold value.

Embodiments include the system above wherein adjusting the one or more exiting PI values includes updating the one or more existing PI values to the one or more new PI values, if the one or more new PI values are greater than the threshold value.

Embodiments include the system above wherein the write tracking mechanism is further to restore, during a refresh period, current parameters associated with the valid data eye if monitoring is expected to continue beyond the refresh period into a next refresh period.

Embodiments include the system above wherein the write tracking mechanism is further to initiate additional write commands during the next refresh period to continue monitoring movements of the valid data eye Embodiments include the system above wherein drifting in the movement is caused by thermal variations in the memory device.

Embodiments include the system above wherein the memory device comprises a graphic double data rate (GDDR) memory device.

In another embodiment, an apparatus comprises means for performing any one or more of the operations mentioned above.

In yet another embodiment, at least one machine-readable comprising a plurality of instructions that in response to being executed on a computing device, causes the computing device to carry out a method according to any one or more of the operations mentioned above.

In yet another embodiment, a computing device is arranged to perform a method according to any one or more of the operations mentioned above.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A method comprising:
monitoring movements of a valid data eye associated with a memory device of a plurality of memory devices of a memory system at a computing system, wherein monitoring includes initiating write commands during one or more refresh periods associated with the valid data eye, wherein the one or more refreshed periods are identified from a plurality of refresh periods, wherein monitoring is performed continuously or for a predefined period of time based upon one or more factors including memory size, system resources, amount of eve-drifting data to be monitored, and number of adjustments, wherein the predefined period of time is selected automatically or by a user;
determining drifting in the movement of the data eye, wherein determining includes searching a phase interpolator ("PI") value or computing a PI value; and correcting the drifting associated with the movements of the data eye, wherein correcting includes adjusting the searched PI value or the computed PI value if at least one of the searched and computed PI values is greater than a threshold value, wherein the threshold value includes a predefined PI value based on predicted or computed temperature variations,
wherein a first monitoring at an end of a first refresh period continues as a second monitoring at a start of a second refresh period to facilitate continuity of the monitoring of the movements during the one or more refresh periods, wherein the second refresh period is immediately subsequent to the first refresh period, wherein monitoring comprising checking a left edge and a right edge of the valid data eye, where checking begins with the left edge moving onwards the right edge.

2. The method of claim 1, further comprising restoring, during a refresh period, current parameters associated with the valid data eye if monitoring is expected to continue beyond the refresh period into a next refresh period, wherein the first monitoring remaining incomplete in the first refresh period is restored as the second monitoring in the second refresh period using an old portion of the PI value associated with the first refresh period in the second refresh period, wherein a new portion of the PI value associated with the second refresh period is generated based on the old portion of the PI value associated with the first refresh period, wherein the write commands include at least one of one or more of normal write training commands and one or more of restored write training commands.

3. The method of claim 2, further comprising initiating additional write commands during the next refresh period to continue monitoring movements of the valid data eye.

4. The method of claim 1, wherein drifting in the movement is caused by thermal variations in the memory device.

5. The method of claim 1, wherein adjusting further comprises:
comparing the searched PI value with the computed PI value to determine whether the searched PI value matches the computed PI value; and
applying an adjustment offset value to the searched PI value or the computed PI value to generate an adjusted PI value, if the searched PI value does not match the computed PI value.

6. A memory controller comprising:
a write tracking mechanism having
first logic to monitor movements of a valid data eye associated with a memory device of a plurality of memory devices of a memory system at a computing system, wherein monitoring includes initiating write commands during one or more refresh periods associated with the valid data eye, wherein the one or more refreshed periods are identified from a plurality of refresh periods, wherein monitoring is performed continuously or for a predefined period of time based upon one or more factors including memory size, system resources, amount of eve-drifting data to be monitored, and number of adjustments, wherein the predefined period of time is selected automatically or by a user;
second logic to determine drifting in the movement of the data eye, wherein determining includes searching a phase interpolator ("PI") value or computing a PI value; and
third logic to correct the drifting associated with the movements of the data eye, wherein correcting includes adjusting the searched PI value or the computed PI value if at least one of the searched and computed PI values is greater than a threshold value, wherein the threshold value includes a predefined PI value based on predicted or computed temperature variations,
wherein a first monitoring at an end of a first refresh period continues as a second monitoring at a start of a second refresh period to facilitate continuity of the monitoring of the movements during the one or more refresh periods, wherein the second refresh period is immediately subsequent to the first refresh period, wherein monitoring comprising checking a left edge and a right edge of the valid data eye, where checking begins with the left edge moving onwards the right edge.

7. The memory controller of claim 6, wherein the one or more refreshed periods are identified from a plurality of refresh periods, wherein monitoring is performed continuously or for a predefined period of time based upon one or more factors including memory size, system resources, amount of eye-drifting data to be monitored, and number of adjustments, wherein the predefined period of time is selected automatically or by a user, wherein the first logic is further to check a left edge and a right edge of the valid data eye, where checking begins with the left edge moving onwards the right edge.

8. The memory controller of claim 6, wherein the third logic is further to restore, during a refresh period, current parameters associated with the valid data eye if monitoring is expected to continue beyond the refresh period into a next refresh period, wherein the first monitoring remaining incomplete in the first refresh period is restored as the second monitoring in the second refresh period using an old portion of the PI value associated with the first refresh period in the second refresh period, wherein a new portion of the PI value associated with the second refresh period is generated based on the old portion of the PI value associated with the first refresh period, wherein the write commands include at least one of one or more of normal write training commands and one or more of restored write training commands.

9. The memory controller of claim 8, wherein the first logic is further to initiate additional write commands during the next refresh period to continue monitoring movements of the valid data eye.

10. The memory controller of claim 6, wherein drifting in the movement is caused by thermal variations in the memory device.

11. The memory controller of claim 6, wherein adjusting further comprises:
comparing the searched PI value with the computed PI value to determine whether the searched PI value matches the computed PI value; and
applying an adjustment offset value to the searched PI value or the computed PI value to generate an adjusted PI value, if the searched PI value does not match the computed PI value.

12. A system comprising:
a plurality of memory devices at a computing system; and
a write tracking mechanism to
monitor movements of a valid data eye associated with a memory device of the plurality of memory devices, wherein monitoring includes initiating write commands during one or more refresh periods associated with the valid data eye, wherein the one or more refreshed periods are identified from a plurality of refresh periods, wherein monitoring is performed continuously or for a predefined period of time based upon one or more factors including memory size, system resources, amount of eve-drifting data to be monitored, and number of adjustments, wherein the predefined period of time is selected automatically or by a user,
determine drifting in the movement of the data eye, wherein determining includes searching a phase interpolator ("PI") value or computing a PI value, and
correct the drifting associated with the movements of the data eye, wherein correcting includes adjusting the searched PI value or the computed PI value if at least one of the searched and computed PI values is greater than a threshold value, wherein the threshold value includes a predefined PI value based on predicted or computed temperature variations,
wherein a first monitoring at an end of a first refresh period continues as a second monitoring at a start of a second refresh period to facilitate continuity of the monitoring of the movements during the one or more refresh periods, wherein the second refresh period is immediately subsequent to the first refresh period, wherein monitoring comprising checking a left edge and a right edge of the valid data eye, where checking begins with the left edge moving onwards the right edge.

13. The system of claim 12, wherein the one or more refreshed periods are identified from a plurality of refresh periods, wherein monitoring is performed continuously or for a predefined period of time based upon one or more factors including memory size, system resources, amount of eye-drifting data to be monitored, and number of adjustments, wherein the predefined period of time is selected automatically or by a user, wherein the write tracking mechanism is further to check a left edge and a right edge of the valid data eye, where checking begins with the left edge moving onwards the right edge.

14. The system of claim 12, wherein the write tracking mechanism is further to restore, during a refresh period, current parameters associated with the valid data eye if monitoring is expected to continue beyond the refresh period into a next refresh period, wherein the first monitoring remaining incomplete in the first refresh period is restored as the second monitoring in the second refresh period using an old portion of the PI value associated with the first refresh period in the second refresh period, wherein a new portion of the PI value associated with the second refresh period is generated based on the old portion of the PI value associated with the first refresh period, wherein the write commands include at least one of one or more of normal write training commands and one or more of restored write training commands.

15. The system of claim 14, wherein the write tracking mechanism is further to initiate additional write commands during the next refresh period to continue monitoring movements of the valid data eye.

16. The system of claim 12, wherein drifting in the movement is caused by thermal variations in the memory device.

17. The system of claim 12, wherein the memory device comprises a graphic double data rate (GDDR) memory device.

18. The system of claim 12, wherein adjusting further comprises:
comparing the searched PI value with the computed PI value to determine whether the searched PI value matches the computed PI value; and
applying an adjustment offset value to the searched PI value or the computed PI value to generate an adjusted PI value, if the searched PI value does not match the computed PI value.

19. At least one non-transitory machine-readable medium comprising a plurality of instructions that in response to being executed on a computing device, causes the computing device to perform the following operations:
monitoring movements of a valid data eye associated with a memory device of a plurality of memory devices of a memory system at a computing system, wherein monitoring includes initiating write commands during one or more refresh periods associated with the valid data eye, wherein the one or more refreshed periods are identified from a plurality of refresh periods, wherein monitoring is performed continuously or for a predefined period of time based upon one or more factors including memory size, system resources, amount of eye-drifting data to be monitored, and number of adjustments, wherein the predefined period of time is selected automatically or by a user;
determining drifting in the movement of the data eye, wherein determining includes searching a phase interpolator ("PI") value or computing a PI value; and correcting the drifting associated with the movements of the data eye, wherein correcting includes adjusting the searched PI value or the computed PI value if at least one of the searched and computed PI values is greater than a threshold value, wherein the threshold value includes a predefined PI value based on predicted or computed temperature variations,
wherein a first monitoring at an end of a first refresh period continues as a second monitoring at a start of a second refresh period to facilitate continuity of the monitoring of the movements during the one or more refresh periods, wherein the second refresh period is immediately subsequent to the first refresh period, wherein monitoring comprising checking a left edge and a right edge of the valid data eye, where checking begins with the left edge moving onwards the right edge.

20. The non-transitory machine-readable medium of claim 19, wherein the one or more refreshed periods are identified from a plurality of refresh periods, wherein monitoring is performed continuously or for a predefined period of time based upon one or more factors including memory size, system resources, amount of eye-drifting data to be monitored, and number of adjustments, wherein the predefined period of time is selected automatically or by a user, wherein the instructions when executed, further cause the computing device to perform the following operation: checking a left edge and a right edge of the valid data eye, where checking begins with the left edge moving onwards the right edge.

21. The non-transitory machine-readable medium of claim 19, wherein the instructions when executed, further cause the computing device to perform the following operation: restoring, during a refresh period, current parameters associated with the valid data eye if monitoring is expected to continue beyond the refresh period into a next refresh period, wherein the first monitoring remaining incomplete in the first refresh period is restored as the second monitoring in the second refresh period using an old portion of the PI value associated with the first refresh period in the second refresh period, wherein a new portion of the PI value associated with the second refresh period is generated based on the old portion of the PI value associated with the first refresh period, wherein the write commands include at least one of one or more of normal write training commands and one or more of restored write training commands.

22. The non-transitory machine-readable medium of claim 21, wherein the instructions when executed, further cause the computing device to perform the following operation: initiating additional write commands during the next refresh period to continue monitoring movements of the valid data eye.

23. The non-transitory machine-readable medium of claim 19, wherein drifting in the movement is caused by thermal variations in the memory device.

24. The non-transitory machine-readable medium of claim 19, wherein adjusting further comprises:
comparing the searched PI value with the computed PI value to determine whether the searched PI value matches the computed PI value; and
applying an adjustment offset value to the searched PI value or the computed PI value to generate an adjusted PI value, if the searched PI value does not match the computed PI value.

* * * * *